United States Patent
Albert et al.

(10) Patent No.: US 10,785,883 B2
(45) Date of Patent: Sep. 22, 2020

(54) ELECTRONIC ARRANGEMENT, COMBINATION, AND METHOD FOR INSTALLATION OF AN ELECTRONIC ARRANGEMENT

(71) Applicant: CONTI TEMIC MICROELECTRONIC GMBH, Nuremberg (DE)

(72) Inventors: Andreas Albert, Hoechstadt/Aisch (DE); Joachim Buhl, Nuremberg (DE); Turhan Bueyuekbas, Fuerth (DE); Andreas Plach, Forchheim (DE); Matthias Wieczorek, Neunkirchen am Sand (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 175 days.

(21) Appl. No.: 15/766,920

(22) PCT Filed: Sep. 9, 2016

(86) PCT No.: PCT/EP2016/071265
§ 371 (c)(1),
(2) Date: Apr. 9, 2018

(87) PCT Pub. No.: WO2017/060034
PCT Pub. Date: Apr. 13, 2017

(65) Prior Publication Data
US 2018/0302998 A1 Oct. 18, 2018

(30) Foreign Application Priority Data
Oct. 9, 2015 (DE) .................. 10 2015 219 569

(51) Int. Cl.
*G01D 11/24* (2006.01)
*H05K 5/00* (2006.01)
(Continued)

(52) U.S. Cl.
CPC ......... *H05K 5/0082* (2013.01); *G01D 11/245* (2013.01); *H01R 12/7082* (2013.01);
(Continued)

(58) Field of Classification Search
CPC ....... G01D 11/245; H05K 5/065; H05K 5/066
See application file for complete search history.

(56) References Cited

U.S. PATENT DOCUMENTS 5,245,258 A * 9/1993 Becker ................. H02K 5/143
318/10
6,398,571 B1 6/2002 Nishide et al.
(Continued)

FOREIGN PATENT DOCUMENTS

CN 1264936 A 8/2000
CN 101584257 A 11/2009
(Continued)

OTHER PUBLICATIONS

ZVEI: Die Elektroindustrie, "Die Welt der Steckverbinder" Technologien und Trends, Aug. 27, 2015 http://www.zvei.org/Publikationen/ZVEI-Imagebroschuere-Steckverbinder-2015.
(Continued)

*Primary Examiner* — Jamel E Williams
(74) *Attorney, Agent, or Firm* — Laurence A. Greenberg; Werner H. Stemer; Ralph E. Locher

(57) ABSTRACT

An electronic configuration, which is preferably a gearbox control device, has a control circuit and a sensor dome. The sensor dome has a sensor and dome contacts electrically connected to the sensor. The control circuit has circuit contacts for contacting the dome contacts. The dome contacts and the circuit contacts are configured to achieve a respective plug connection between a respective dome contact and a respective circuit contact.

20 Claims, 2 Drawing Sheets

(51) Int. Cl.
  *H01R 12/70* (2011.01)
  *H01R 13/621* (2006.01)
  *H05K 5/06* (2006.01)

(52) U.S. Cl.
  CPC ......... *H01R 13/621* (2013.01); *H05K 5/0008* (2013.01); *H05K 5/0069* (2013.01); *H05K 5/065* (2013.01); *H05K 5/066* (2013.01); *H05K 5/069* (2013.01)

(56) References Cited

U.S. PATENT DOCUMENTS

| | | | |
|---|---|---|---|
| 7,373,826 B2 | 5/2008 | Weber et al. | |
| 7,600,443 B2 | 10/2009 | Ott | |
| 7,782,627 B2 | 8/2010 | Gramann et al. | |
| 8,029,188 B2 | 10/2011 | Park | |
| 8,089,773 B2 | 1/2012 | Loibl et al. | |
| 8,286,469 B2 | 10/2012 | Karrer et al. | |
| 8,396,631 B2 | 3/2013 | Bueyuekbas et al. | |
| 8,733,182 B2 | 5/2014 | Huizinga et al. | |
| 9,212,936 B2 * | 12/2015 | Wenk | G01D 11/245 |
| 9,763,344 B2 * | 9/2017 | Ott | H01L 23/057 |
| 10,237,979 B2 * | 3/2019 | Liskow | H05K 3/284 |
| 2002/0149916 A1 * | 10/2002 | Kurle | H01R 12/585 |
| | | | 361/752 |
| 2003/0001448 A1 * | 1/2003 | Kaeufl | H02K 5/148 |
| | | | 310/91 |
| 2010/0002403 A1 * | 1/2010 | Loibl | H05K 1/147 |
| | | | 361/749 |
| 2010/0198465 A1 * | 8/2010 | Buyukbas | B60R 11/02 |
| | | | 701/49 |
| 2018/0023982 A1 * | 1/2018 | Henniger | G01D 11/245 |
| | | | 73/431 |
| 2018/0177058 A1 * | 6/2018 | Liskow | H05K 3/284 |
| 2018/0299348 A1 * | 10/2018 | Albert | H05K 5/0082 |

FOREIGN PATENT DOCUMENTS

| | | |
|---|---|---|
| CN | 102879131 A | 1/2013 |
| CN | 104012194 A | 8/2014 |
| DE | 4441889 A1 | 6/1995 |
| DE | 19612579 A1 | 10/1997 |
| DE | 19818507 A1 | 10/1999 |
| DE | 10031167 A1 | 1/2002 |
| DE | 10110620 A1 | 9/2002 |
| DE | 102004002034 A1 | 8/2005 |
| DE | 102005005897 B3 | 5/2006 |
| DE | 102005040169 A1 | 3/2007 |
| DE | 102006008752 A1 | 9/2007 |
| DE | 102006053407 A1 | 5/2008 |
| DE | 102008008336 A1 | 9/2008 |
| DE | 102008014457 A1 | 9/2008 |
| DE | 102007025859 A1 | 12/2008 |
| DE | 102007025890 A1 | 12/2008 |
| DE | 102008031571 A1 | 1/2010 |
| DE | 102011009156 A1 | 7/2012 |
| DE | 102012110597 A1 | 5/2013 |
| DE | 102012213916 A1 | 5/2013 |
| DE | 102011088037 A1 | 6/2013 |
| DE | 102012214317 A1 | 2/2014 |
| DE | 102013212940 A1 | 12/2014 |
| DE | 102013224836 A1 | 6/2015 |
| DE | 102013226394 A1 | 6/2015 |
| DE | 102014216587 A1 | 9/2015 |
| DE | 102014216590 A1 | 9/2015 |
| DE | 102014212296 A1 | 12/2015 |
| DE | 102014217556 A1 | 3/2016 |
| EP | 1910133 B1 | 6/2010 |
| EP | 2122784 B1 | 1/2014 |
| JP | 2006026715 A | 2/2006 |
| JP | 2007071856 A | 3/2007 |
| JP | 2010509742 A | 3/2010 |
| KR | 100648416 B1 | 11/2006 |
| KR | 2010509742 A | 3/2010 |

OTHER PUBLICATIONS

2E: "Mechatronic Katalog Steckverbinder" 2012 http://www.2e-mechatronic.de/tl_files/datenblaetter/Katalog_Steckverbinder.pdf.

* cited by examiner

ELECTRONIC ARRANGEMENT, COMBINATION, AND METHOD FOR INSTALLATION OF AN ELECTRONIC ARRANGEMENT

BACKGROUND OF THE INVENTION

Field of the Invention

The present invention relates to an electronic arrangement, which is in particular a transmission controller, comprising a control circuit and a sensor dome, wherein the sensor dome has a sensor and dome contacts which are electrically connected to the sensor, and wherein the control circuit has circuit contacts for making contact with the dome contacts.

Prior Art

Electronic arrangements of this kind are used, amongst other things, for motor vehicle transmissions. The requirements of automobile manufacturers in respect of robustness of a control system in the engine compartment and in the transmission are continuously increasing. The requirements also include insensitivity of a transmission control system to chemical attacks by aggressive media and oils in the transmission or in the engine compartment. Against this background, the prior art discloses, for the purpose of robust and reliable electrical connection of circuit contacts to dome contacts, that the circuit contacts and the dome contacts are soldered to one another. However, it was found to be disadvantageous here that, on account of the high temperatures which occur during a soldering process (the said temperatures can lie in the region of 230° C. for example), depending on the design of the sensor dome, it is not possible to prevent the functionality of the sensor and/or the dimensional tolerance of the sensor dome being adversely affected. Another limitation is considered to be that soldering of the contacts often already has to take place at an early time and that then sensor domes of particularly high or elongate construction are obstructive to further assembly processes. Long sensor domes, such as rotation speed or gear selector sensor domes for example, are often required in the prior art.

SUMMARY OF THE INVENTION

Proceeding from the described background, the object of the invention is to advantageously develop an electronic arrangement of the kind described at the outset. In particular, the aim is that it is possible to avoid the described disadvantages and limitations as far as possible owing to the development.

For the purpose of achieving said object, the invention proposes that the dome contacts and the circuit contacts are designed to provide a respective plug-in connection between a respective dome contact and a respective circuit contact. An electrical connection is produced between a respective dome contact and a respective circuit contact on account of this respective plug-in connection. As a result, contact-connection by means of the soldering method which was selected in the prior art can be dispensed with. Consequently, heating of the surrounding area when contact-connection is made, which heating has to be accepted in the prior art, does not occur either. An additional advantage is that a plug-in connection can be made without the equipment which is required for a solder connection and consequently can made in a flexible manner in respect of time. Furthermore, the invention makes it possible for the electrical connection between the sensor dome and the control circuit to be insensitive to the media which is present in a transmission compartment or engine compartment and also to satisfy even high requirements in respect of robustness. In the case of an arrangement of the electronic arrangement in the interior of a transmission, as is preferred by the invention, the control circuit can also be called an integrated control electronics system to which the sensor dome is intended to be fitted. The term control electronics can also be used instead of control circuit. Particularly when the sensor dome or the sensor domes have a comparatively large overall length (this may be necessary in order to position a sensor at its site of use), it has proven to be advantageous that the sensor dome or the sensor domes can be fitted only at the end of a production process too. The circuit contacts and the dome contacts are preferably designed such that the plug-in connection which is formed by them in respective pairs allows for multiple plug connections, that is to say can be released and plug-connected again as required. It is possible that an electronic arrangement according to the invention comprises more than one sensor dome, that is to say, for example, two, three or more sensor domes which can each be connected to the control circuit in the manner according to the invention.

The control circuit is preferably a transmission control system or a constituent part of a transmission control system. For example, the control circuit can serve to control one or more valves which are arranged in a transmission. The invention relates to the electronic arrangement preferably in an assembly state in which the dome contacts and the circuit contacts in pairs form a respective plug-in connection with one another. However, the electronic arrangement is not necessarily already assembled, but rather the invention also comprises an electronic arrangement in which the control circuit and the sensor dome are still arranged loosely in relation to one another, that is to say also comprises a loose combination of these components.

There are numerous further possibilities for the preferred development:

It is preferred that the dome contacts and the circuit contacts are designed to jointly provide a respective plug-in clamping connection between a respective dome contact and a respective circuit contact or are matched to one another for this purpose. The clamping force which acts in a plug-in clamping connection of this kind can prevent unintentional loosening of the plug-in connection. It is preferred that a respective dome contact is designed as an insulation-displacement contact, and that a respective circuit contact is designed as a blade contact. As an alternative, it would be possible that dome contacts are designed as blade contacts and circuit contacts are designed as insulation-displacement contacts. In both variants, insulation-displacement contact-connection entails technical advantages. For example, insulation-displacement contact-connections have the advantageous property of permitting multiple plug connections. One advantage of the insulation-displacement contact-connection is also that the clamping connection and the associated electrical contact-connection are active in a certain plug-in travel interval. This allows for compensation of tolerances and can also be advantageous for a possible connection of a protective housing of a sensor dome by means of plastic laser welding.

The sensor of the sensor dome may be, for example, a rotation speed sensor or a gear selector sensor. Accordingly, a so-called rotation speed sensor dome or a gear selector sensor dome could accordingly be referred to. Both types of dome often have an elongate structural shape in order to localize the sensor to a position which is required for sensor operation.

It is considered to be expedient that the sensor dome has a protective housing which surrounds the sensor on several sides, preferably on all sides. It is possible here, for example, that the protective housing contains plastic or is composed of plastic, wherein it is provided, in particular, that the sensor is embedded into the plastic. For example, the sensor can be encapsulated with plastic by injection molding on several or on all sides.

It is preferred that the dome contacts and/or the circuit contacts contain brass or are produced from brass. By way of example, brass contacts are durable and do not deposit any copper in transmission oil by means of chemical reactions which can lead to a short circuit by means of boundary layer formation. As a generalization of this idea, the dome contacts and/or the circuit contacts can be produced from metal which has a higher degree of corrosion resistance, preferably to transmission oil, than steel.

An expedient refinement is that the circuit contacts of the control circuit lead into a plug which is connected to the control circuit and has a plug base and a plug collar which originates from the plug base, wherein the plug collar extends along a plug periphery, in particular in a manner closed at the periphery, and wherein the circuit contacts project beyond the plug base. In conjunction with this, it is preferred, in particular, that the protective housing of the sensor dome has a connection section in which a housing connection wall forms a supporting surface which extends transversely, in particular perpendicularly, in relation to a longitudinal direction of the sensor dome, wherein the supporting surface overlaps a collar end of the plug collar, which collar end is averted from the plug base, when the dome contacts and the circuit contacts are plug-connected for the purpose of forming plug-in clamping connections. Said longitudinal direction can extend, for example, between the sensor and the dome contacts. In this way, a closed plug chamber can be formed, which protects the plug-in connection, for example, against loose foreign bodies or the like or against external adverse mechanical effects. In respect of a preferred use of the electronic arrangement in the interior of a transmission housing, a boundary of the plug chamber is preferred, which boundary protects the plug-in connections, for example, against conductive slurry or else, for example, chips in the transmission. If, in this case, the contact-making chamber in which the plug-in connection which establishes the electrical connection is located is not sealed off to the outside in a media-tight manner, it is advantageous when the circuit contacts and dome contacts are produced from a metal which does not corrode or corrodes only comparatively slowly. However, it is possible that the housing connection wall and the collar end are connected to one another continuously, for example by means of plastic laser welding, in a sealed-off manner at the plug periphery. A contact-making chamber which is sealed off to the outside can be formed in this way. Said seal may preferably be a media-tight seal, for example a seal which is also effective against transmission oils. As a result, additional screws, seals (in particular molded seals) for sealing purposes etc. can be dispensed with. It is possible that the welding process is simultaneously used for force-monitoring plug-connection of the sensor dome connection. Sealing off of the plug interface can preferably be performed by circumferential plastic laser welding. A plug collar can be configured, for example, as a circumferential welding rib. A circumferential plug collar can have a plastic welding geometry, for example with a circumferential welding rib design. It is also possible that a plurality of sensor domes in a sensor dome module are simultaneously sealed off in a media-tight manner by a laser welding operation and are simultaneously electrically contacted by means of insulation-displacement contacts.

It is possible that the control circuit has a printed circuit and a carrier housing which is connected to the printed circuit, that the circuit contacts are soldered onto the printed circuit, and that the printed circuit and the carrier housing are encapsulated with plastic by injection molding so as to form an opening for the plug collar to pass through. The plastic may be, for example, a thermoset. The printed circuit may be, for example, a PCB which is attached to a carrier housing. The plug collar can be encapsulated with plastic by injection molding, for example, in a media-tight manner. As a result, media-tight protection of, for example, a soldering point can also be achieved.

It is possible that the control circuit is connected to a carrier housing, in particular which is composed of metal, and that the protective housing of the sensor dome is positioned on the carrier housing by means of at least one interlocking bearing means and/or is screwed-connected to the carrier housing. Depending on the configuration, chip or slurry protection can also be achieved in this case. An additional advantage is the ability to replace the sensor dome in a simple manner, for example for modernization purposes or else taking into account a platform idea. Further advantages can be ease of maintenance, extension of the service life of the actual control electronics and, for example, simplified standardization. A design of this kind can provide advantages for applications in which media-tight sealing off is not required. However, a solution of this kind can be used, for example, for modernizing a transmission platform by replacement by newer-generation sensor domes. In addition, the ease of maintenance of integrated control electronics can be improved and, for example, the service life of transmission control systems can be extended. A transmission control system of this kind could operate, for example, a plurality of transmission platforms. For example, sensor domes or sensor dome modules, which are adapted in respect of their position, could be fitted to the integrated control electronics and platform independence could be achieved in this way. A comparatively expensive control electronics system could remain unchanged. It may also be possible to operate a different transmission platform only by software updates.

It is possible that the sensor dome has a plurality of sensors, wherein each sensor is electrically connected to a plurality of dome contacts, wherein the dome contacts are arranged in a contact area and a main surface of the contact area is bordered by the housing connection wall.

It is possible that the control circuit is an electronic circuit which is suitable for or adapted for the purpose of open-loop control and/or closed-loop control of a transmission.

The invention also relates to a combination comprising a transmission housing and an electronic arrangement which is arranged thereon and can exhibit individual features or several features from amongst the features described above. In this respect, the electronic arrangement can be referred to as an integrated control electronics system.

The invention also relates to a method for assembling an electronic arrangement which comprises a control circuit and a sensor dome, said method comprising the method steps of:

providing a sensor dome which has a sensor and dome contacts which are electrically connected to the sensor, providing a control circuit which has circuit contacts for making contact with the dome contacts.

In order to advantageously develop a method of this kind, the invention proposes that either dome contacts are designed as insulation-displacement contacts and circuit contacts are designed as blade contacts, or that dome contacts are designed as blade contacts and circuit contacts are designed as insulation-displacement contacts, that the circuit contacts (4) of the control circuit (2) lead into a plug (14) which has a plug base (15) and a plug collar (16) which originates from the plug base (15), wherein the plug collar (16) extends along a plug periphery, in particular in a manner closed at the periphery, and wherein the circuit contacts (4) project beyond the plug base (15), that a protective housing (6) of the sensor dome (3) has a connection section (17) in which a housing connection wall (18) forms a supporting surface (19) which extends transversely, in particular perpendicularly, in relation to a longitudinal direction (L) of the sensor dome (3), and wherein the supporting surface (19) overlaps a collar end (20) of the plug collar (16), which collar end is averted from the plug base (15), when the dome contacts (7) and the circuit contacts (4) are plug-connected for the purpose of providing plug-in clamping connections (10'), that the sensor dome (3) is plugged-mounted onto the control circuit (2), so that a respective circuit contact (4) forms a plug-in clamping connection (10') with a respective dome contact (7), and that the housing connection wall and the plug collar are connected to one another by means of plastic laser welding during at least one subsection of the plug-mounting operation.

The components which are selected for the method can exhibit individual features or several features from amongst the features described above. For the purpose of advantageous development, it is possible that the assembly force which acts between the sensor dome and the control circuit in the plug-mounting direction during the plug-mounting operation is measured during the plastic laser welding operation. The welding process can advantageously be simultaneously used for force-monitored plug-connection of the sensor dome connection, that is to say for monitoring whether a plug-in force which is sufficient for establishing the plug-in connection is applied. This can be achieved by the assembly force (contact-pressure force) which is applied in the plugging direction between the sensor dome and the control circuit being selected to be so great that it corresponds to the sum of a desired plug-mounting force which is required in order to achieve a reliable electrical plug-in connection and of the contact-pressure force which is required for plastic laser welding. It is possible that at least one sensor dome is attached to an integrated control electronics system by means of plastic laser welding at the end of a production process and is simultaneously contacted by means of the insulation-displacement contacts.

The invention allows numerous technical advantages. Deliberate replacement of all of the sensor domes for newer sensor domes can be performed in vehicle workshops during servicing intervals. As a result, the ease of maintenance can extend the service life of a transmission platform. It is possible to modernize a transmission platform by replacing older-generation sensor domes with newer sensor domes. The transmission control electronics could be modernized by a software update.

It is also possible that integrated transmission control electronics simultaneously cover a plurality of transmission platforms. Standardization of sensor domes for universal installation into an integrated control electronics system is possible.

An insulation-displacement contact-connection operation allows multiple plug-connection operations and tolerance compensation at the sensor domes.

A plug interface can be sealed off in a media-tight manner by means of a plastic laser welding process. As a result, components such as additional screws or else sockets on the sensor dome can be dispensed with.

In the case of, for example, encapsulation of a plug interface with plastic by injection molding on an integrated control electronics system, subsequent plug-connection to the sensor dome can be achieved in that vulnerable electronic components, such as the sensors, are not yet present during the process of encapsulation by injection molding and accordingly are not subjected to the process temperatures either. It is possible that, in particular, long sensor domes can be fitted only at the end of a production process and therefore do not disrupt processes such as, for example, wire bonding. By way of example, bonding heads could otherwise collide with a sensor dome. A robust plug-in connection without additional sealing-off measures can be achieved by virtue of it being possible for insulation-displacement contacts of the sensor dome and blade contacts of the integrated control electronics to be produced from metal which does not corrode or which corrodes only with difficulty.

BRIEF DESCRIPTION OF THE DRAWINGS

The invention will now be described by way of example below with reference to the appended figures, in which.

DESCRIPTION OF THE EMBODIMENTS

Figure 1:
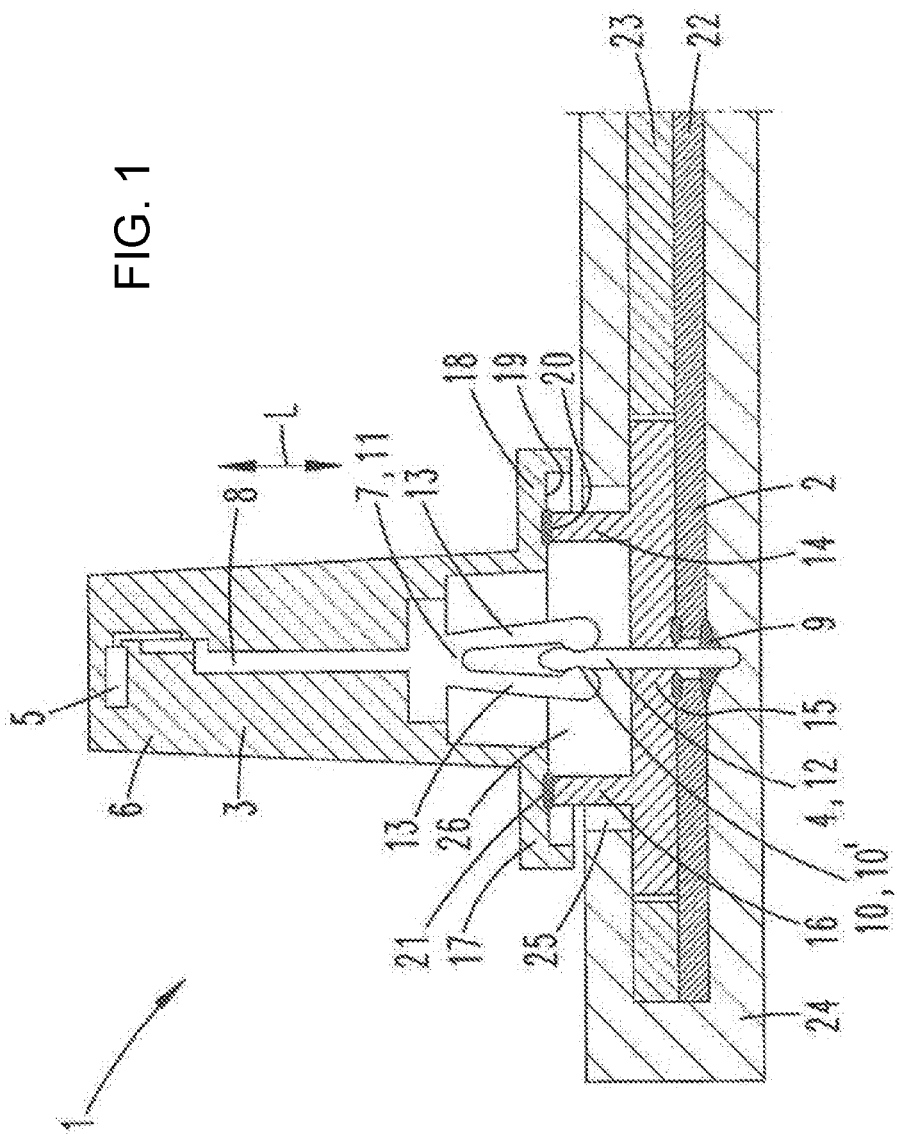
FIG. 1 shows a partially sectioned view through an electronic arrangement according to the invention in line with a first exemplary embodiment.

An electronic arrangement 1 according to the invention in line with a first exemplary embodiment is presented with reference to FIG. 1. In the example, the electronic arrangement 1 is a constituent part of a transmission controller and is exposed to transmission oil in the interior of a transmission housing, not also illustrated. The electronic arrangement 1 comprises a control circuit 2, illustrated in a simplified manner, the circuit elements of said control circuit not being illustrated in detail. The control circuit 2 comprises a plurality of circuit contacts 4, one circuit contact 4 of said plurality of circuit contacts being located in the sectional plane selected in FIG. 1. The sensor dome 3 comprises a sensor 5 which is arranged in the region of a first longitudinal end in a protective housing 6 of the sensor dome 3, which protective housing is formed from plastic. The sensor 5 is electrically conductively connected to a plurality of dome contacts 7, one dome contact 7 of said plurality of dome contacts being located in the sectional plane selected in FIG. 1. The electrical connection between the sensor 5 and a respective dome contact 7 is formed by means of an elongate electrical conductor 8. The circuit contacts 4 are each connected to electronic components of the control circuit 2 by means of a solder connection 9 in a manner not illustrated in any detail. The circuit contacts 4 and the dome contacts 7 serve for making reciprocal contact-connection.

Said contacts are matched to one another in respect of their configuration, so that a circuit contact 4 and a dome contact 7 can in each case be plug-connected for the purpose of establishing a plug-in connection 10 between the dome contact 7 and the circuit contact 4. FIG. 1 shows a use state in which the sensor dome 3 is already plug-mounted onto the control circuit 2.

In the example, the dome contacts 7 are designed as insulation-displacement contacts 11, and the circuit contacts 4 are designed as blade contacts 12. When the sensor dome 3 is plug-mounted onto the control circuit 2 for the purpose of making contact, the two limbs 13 of a respective insulation-displacement contact 11 engage around the free longitudinal end of a blade contact 12. During the plug-mounting operation, the limbs 13 are bent away from one another against an elastic spring force, so that a plug-in clamping connection 10', that is to say a plug-in connection which is held by means of a clamping force, results.

In the example, the sensor 5 is a gear selector sensor. The sensor 5 can be, for example, soldered or connected in some other way to its electrical conductors 8 (one electrical conductor 8 from amongst said electrical conductors being illustrated in FIG. 1). At its other longitudinal end, the electrical conductor 8 can be, for example, likewise soldered to or, for example, integrally produced with the dome contact 7. In the example, the sensor 5 is embedded by way of its electrical conductors 8 into the protective housing 6 of the sensor dome 3. To this end, the sensor 5 and its electrical conductors 8 were encapsulated with plastic by injection molding.

In the example shown in FIG. 1, it is provided that the circuit contacts 4 lead into a plug 14 which is connected to the control circuit 2. Said plug comprises a plug base 15 and a plug collar 16 which originates from said plug base in an annular manner, it being possible for said plug base and said plug collar to each be produced from plastic. The circuit contacts 4 protrude beyond the plug base 15 in their respective longitudinal direction. At its second longitudinal end, which is averted from the sensor 5, the protective housing 6 has a connection section 17 which could also be called the sensor dome base. The sensor dome 3 extends from its first longitudinal end in the region of the sensor 5, along a longitudinal direction L, to the connection section 17 which is formed at its second longitudinal end. At the connection section 17, the cross section of the sensor dome 3 widens in relation to cross-sectional planes which are perpendicular to the longitudinal direction. There, the sensor dome 3 comprises a housing connection wall 18 which initially forms a supporting surface 19, which extends transversely, in the example perpendicularly, in relation to the longitudinal direction L, and which, in the plug-mounted state of the sensor dome 3, overlaps a collar end 20 of the plug collar 16, which collar end is averted from the plug base 15, for axially supporting the sensor dome 3 on the plug 14. In the electronic arrangement 1 shown in FIG. 1, the housing connection wall 18 was continuously cohesively connected by means of plastic laser welding in the region of its supporting surface 19 to the collar end 20 in a manner closed along the plug periphery, so that circumferential sealing off results. The laser welding connection is denoted by 21. As a result of the plastic melting on the housing connection wall 18, said housing connection wall merges directly integrally with the plug collar 16 there, so that the supporting surface 19 is no longer present there after the plastic laser welding.

FIG. 1 schematically shows that the control circuit 2 has a printed circuit 22 and a carrier housing 23 which is connected to said printed circuit. Said carrier housing forms an opening into which the plug base 15 is inserted. The circuit contacts 4 are soldered to the printed circuit 22. The printed circuit 22 and its carrier housing 23 are encapsulated with plastic 24, with thermoset in the example, by injection molding, wherein an opening 25 is left for the plug collar 16 to pass through. The plug-in clamping connection 10' is located in a contact-making chamber 26 which is bordered by the plug 14 and the sensor dome 3 and which is sealed off from the outer surrounding area by means of the laser welding connection 21 at the contact zone, so that no transmission oil or the like can penetrate.

In a method for assembling an arrangement 1 of this kind, which method is proposed by the invention, the procedure described now can preferably be followed. In this case, the sensor dome 3 can initially be plug-mounted onto the circuit contacts 4 by way of its dome contacts 7 until the supporting surface 19 is supported on the collar end 20. The laser welding connection 21 can then be established at this contact region, while the sensor dome 3 is pressed against the plug 14 parallel to the longitudinal direction L of said sensor dome. Owing to the contact-pressing, secure contact is ensured in the contact region during the melting which is caused by the welding process, wherein the melting results in a certain degree of axial lowering of the sensor dome 3. As a result of this, the dome contacts 7 are at the same time plug-mounted yet further onto the circuit contacts 4 during the welding process. In other words, the plastic laser welding can be carried out during at least this second subsection of the plug-mounting of the sensor dome 3 onto the control circuit 2.

Figure 2:
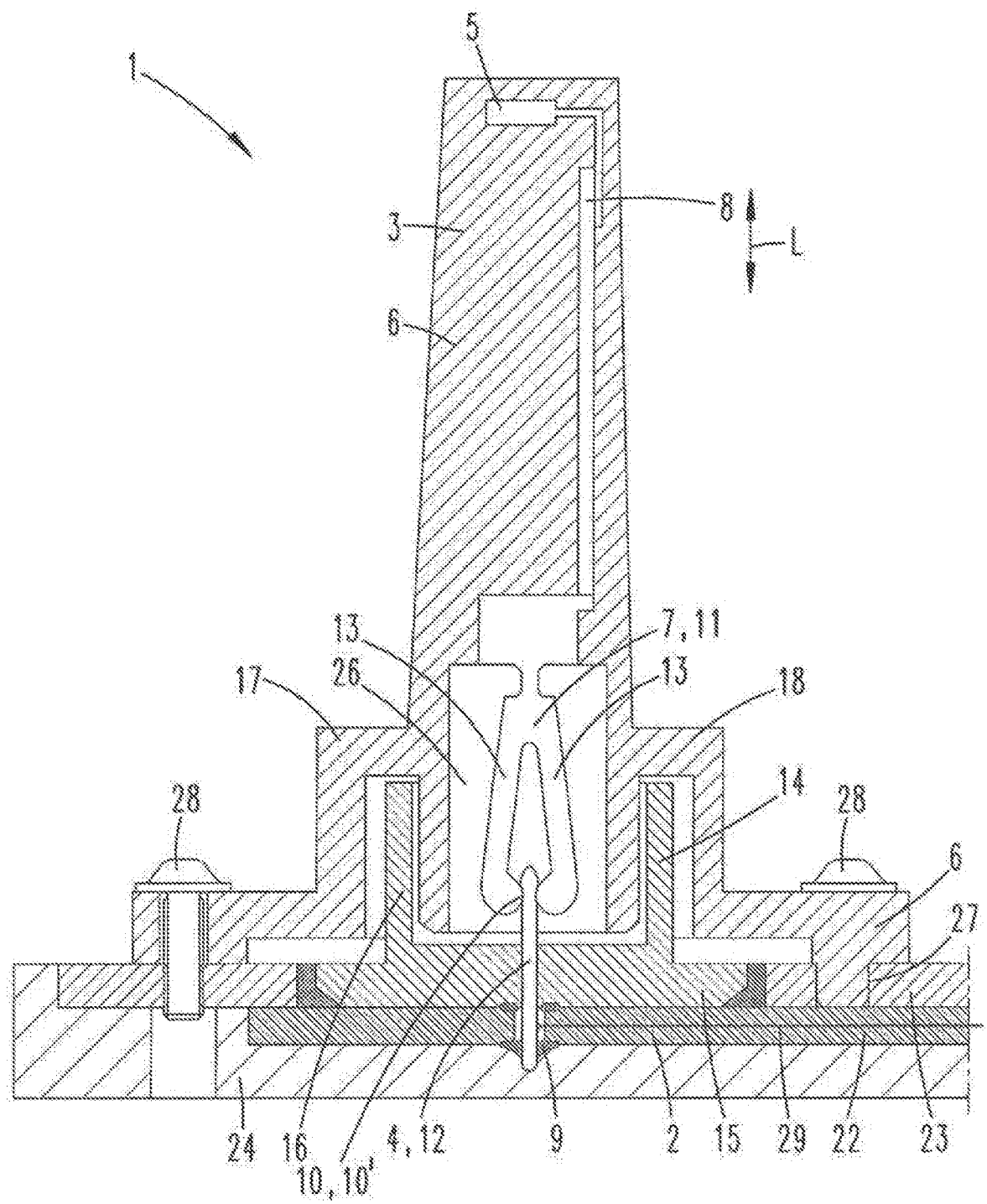
FIG. 2 shows a partially sectioned view through an electronic arrangement according to the invention in line with a second exemplary embodiment.

FIG. 2 shows a second exemplary embodiment of an electronic arrangement 1 according to the invention, wherein features which correspond to the first example or are comparable with said first example are provided with the same reference symbols for reasons of clarity. With regard to such correspondence, reference is made to the preceding description. One common feature is that the circuit contacts 4 are once again blade contacts 12 and the dome contacts 7 are again insulation-displacement contacts 11. One difference is that the protective housing 6 is not attached to the plug 14 by means of a laser welding connection. Instead, it is provided that the protective housing 6 is positioned on the carrier housing 23 by means of an interlocking bearing means 27 (in the example, said interlocking bearing means is an interlocking engagement means) and is screwed-connected to the carrier housing 23 by means of screws 28. The contact-making chamber 26 is bordered by the protective housing 6 and the plug 14, but is not sealed off with respect to the surrounding area since a sealing-off connection has not been selected. Although protection against, for example, chips or the like is provided, the embodiment is not media-tight. In order to avoid corrosion of the circuit contacts 4 and of the dome contacts 7, they are each produced from brass. 29 denotes an electrical conductor which extends in the printed circuit 22.

All of the disclosed features are essential to the invention (on their own, but also in combination with one another). The dependent claims, by way of their features, characterize independent inventive developments of the prior art, in particular in order to carry out divisional applications on the basis of these claims.

LIST OF REFERENCE SYMBOLS

1 Electronic arrangement
2 Control circuit
3 Sensor dome

4 Circuit contact
5 Sensor
6 Protective housing
7 Dome contact
8 Electrical conductor
9 Solder connection
10 Plug-in connection
10' Plug-in clamping connection
11 Insulation-displacement contact
12 Blade contact
13 Limb
14 Plug
15 Plug base
16 Plug collar
17 Connection section
18 Housing connection wall
19 Supporting surface
20 Collar end
21 Laser welding connection
22 Printed circuit
23 Carrier housing
24 Plastic
25 Opening
26 Contact-making chamber
27 Interlocking bearing means
28 Screw
29 Electrical conductor
L Longitudinal direction

The invention claimed is:

1. An electronic configuration, comprising:
a sensor dome having a sensor and dome contacts electrically connected to said sensor; and
a control circuit having circuit contacts for making contact with said dome contacts, said dome contacts and said circuit contacts are configured to provide a respective plug-in connection between a respective dome contact and a respective circuit contact.

2. The electronic configuration according to claim 1, wherein:
said sensor dome is plug-mounted onto said control circuit; and
said respective dome contact and said respective circuit contact form a plug-in connection.

3. The electronic configuration according to claim 1, wherein said dome contacts and said circuit contacts are configured to provide a respective plug-in clamping connection between said respective dome contact and said respective circuit contact.

4. The electronic configuration according to claim 1, wherein:
said dome contacts are insulation-displacement contacts and said circuit contacts are blade contacts; or
said dome contacts are said blade contacts and said circuit contacts are said insulation-displacement contacts.

5. The electronic configuration according to claim 1, wherein said sensor is selected from the group consisting of a rotation speed sensor and a gear selector sensor.

6. The electronic configuration according to claim 1, wherein said sensor dome has a protective housing which surrounds said sensor on several sides.

7. The electronic configuration according to claim 6, wherein said protective housing contains plastic or is composed of said plastic, and said sensor is embedded into said plastic.

8. The electronic configuration according to claim 1, wherein said dome contacts and/or said circuit contacts contain brass or are produced from said brass.

9. The electronic configuration according to claim 6, further comprising a plug connected to said control circuit, said circuit contacts of said control circuit lead into said plug, said plug has a plug base and a plug collar which originates from said plug base, said plug collar extends along a plug periphery, in a manner closed at said plug periphery, and said circuit contacts project beyond said plug base.

10. The electronic configuration according to claim 9, wherein:
said protective housing of said sensor dome has a connection section in which a housing connection wall forms a supporting surface which extends transversely in relation to a longitudinal direction of said sensor dome;
said plug collar has a collar end; and
said supporting surface overlaps said collar end of said plug collar, said collar end is averted from said plug base, when said dome contacts and said circuit contacts are plug-connected for forming plug-in clamping connections.

11. The electronic configuration according to claim 10, wherein said housing connection wall and said collar end are connected to one another continuously in a sealed-off manner at said plug periphery.

12. The electronic configuration according to claim 9, wherein said control circuit has a printed circuit and a carrier housing which is connected to said printed circuit, said circuit contacts are soldered onto said printed circuit, and in that said printed circuit and said carrier housing are encapsulated with plastic by injection molding so as to form an opening for said plug collar to pass through.

13. The electronic configuration according to claim 12, wherein:
said control circuit is connected to said carrier housing;
said carrier housing is composed of metal; and
said protective housing of said sensor dome has at least one interlocking bearing and is positioned on said carrier housing by said at least one interlocking bearing and/or is screwed-connected to said carrier housing.

14. The electronic configuration according to claim 10, wherein:
said sensor of said sensor dome is one of a plurality of sensors;
each of said sensors is electrically connected to a plurality of said dome contacts; and
said dome contacts are disposed in a contact area and a main surface of said contact area is bordered by said housing connection wall.

15. The electronic configuration according to claim 1, wherein said control circuit is an electronic circuit which is suitable for or adapted for open-loop control and/or closed-loop control of a transmission.

16. The electronic configuration according to claim 10, wherein said supporting surface extends perpendicularly in relation to the longitudinal direction of said sensor dome.

17. The electronic configuration according to claim 10, wherein said housing connection wall and said collar end are connected to one another continuously, by means of plastic laser welding, in a sealed-off manner at said plug periphery.

18. A system, comprising:
a transmission housing;
a sensor dome having a sensor and dome contacts electrically connected to said sensor;
a control circuit having circuit contacts for making contact with said dome contacts, said dome contacts and said circuit contacts are configured to provide a respective plug-in connection between a respective dome contact and a respective circuit contact, said control circuit and said sensor dome are constituent parts of an electronic configuration; and said electronic configuration being disposed in an interior of said transmission housing.

19. A method for assembling an electronic configuration having a control circuit and a sensor dome, which comprises the method steps of:

providing a sensor dome having a sensor and dome contacts which are electrically connected to the sensor;

providing a control circuit having circuit contacts for making contact with the dome contacts;

configuring the dome contacts as insulation-displacement contacts and the circuit contacts as blade contacts, or configuring the dome contacts as the blade contacts and the circuit contacts as the insulation-displacement contacts;

leading the circuit contacts of the control circuit into a plug having a plug base and a plug collar which originates from the plug base, the plug collar extending along a plug periphery, in a manner closed at the plug periphery, and the circuit contacts project beyond the plug base, providing the sensor dome with a protective housing, the protective housing having a connection section in which a housing connection wall forms a supporting surface extending transversely in relation to a longitudinal direction of the sensor dome, and the supporting surface overlapping a collar end of the plug collar, the collar end is averted from the plug base, when the dome contacts and the circuit contacts are plug-connected for providing plug-in clamping connections;

plug-mounting the sensor dome onto the control circuit so that a respective circuit contact forms a plug-in clamping connection with a respective dome contact; and connecting the housing connection wall and the plug collar to one another by means of plastic laser welding during at least one subsection of the plug-mounting operation.

20. The method according to claim 19, which further comprises measuring an assembly force which acts between the sensor dome and the control circuit in the plug-mounting direction during the plug-mounting operation during a plastic laser welding operation.

* * * * *